(12) United States Patent
Fukuda et al.

(10) Patent No.: US 9,911,811 B2
(45) Date of Patent: Mar. 6, 2018

(54) METHOD FOR MANUFACTURING SILICON CARBIDE SEMICONDUCTOR DEVICE, METHOD FOR MANUFACTURING SEMICONDUCTOR BASE, SILICON CARBIDE SEMICONDUCTOR DEVICE, AND DEVICE FOR MANUFACTURING SILICON CARBIDE SEMICONDUCTOR DEVICE

(71) Applicant: SHINDENGEN ELECTRIC MANUFACTURING CO., LTD., Tokyo (JP)

(72) Inventors: Yusuke Fukuda, Hanno (JP); Yoshiyuki Watanabe, Hanno (JP)

(73) Assignee: Shindengen Electric Manufacturing Co., Ltd., Tokyo (JP)

( * ) Notice: Subject to any disclaimer, the term of this patent is extended or adjusted under 35 U.S.C. 154(b) by 37 days.

(21) Appl. No.: 15/121,002

(22) PCT Filed: Dec. 11, 2015

(86) PCT No.: PCT/JP2015/084828
§ 371 (c)(1),
(2) Date: Aug. 23, 2016

(87) PCT Pub. No.: WO2017/098659
PCT Pub. Date: Jun. 15, 2017

(65) Prior Publication Data
US 2018/0019307 A1 Jan. 18, 2018

(51) Int. Cl.
*H01L 29/16* (2006.01)
*H01L 23/544* (2006.01)
(Continued)

(52) U.S. Cl.
CPC .... *H01L 29/1608* (2013.01); *H01L 21/02529* (2013.01); *H01L 21/28512* (2013.01);
(Continued)

(58) Field of Classification Search
CPC .......... H01L 29/1608; H01L 21/28512; H01L 29/0619; H01L 21/02529; H01L 23/544;
(Continued)

(56) References Cited

U.S. PATENT DOCUMENTS

| 2013/0025114 A1 | 1/2013 | Mizubata |
| 2016/0149056 A1* | 5/2016 | Nishio ................ H01L 29/8611 257/77 |

FOREIGN PATENT DOCUMENTS

| JP | 2010205824 | 9/2010 |
| JP | 2013030677 | 2/2013 |

(Continued)

OTHER PUBLICATIONS

International Search Report for PCT/JP2015/084828 with English translation from Google Translate.

*Primary Examiner* — Selim Ahmed
(74) *Attorney, Agent, or Firm* — Ladas & Parry, LLP (57) ABSTRACT

A method for manufacturing a silicon carbide semiconductor device comprises: a step for forming a front-surface electrode (30) on a front surface side of a silicon carbide wafer (10); a step for thinning the silicon carbide wafer (10) by reducing a thickness of the silicon carbide wafer (10) from a back surface side thereof; a step for providing a metal layer (21) on the back surface of the thinned silicon carbide wafer (10); a step for irradiating the metal layer (21) with laser light, while applying an external force such that the silicon carbide wafer and the metal layer are planarized, to form the carbide layer (20) obtained by a reaction with carbon in the silicon carbide wafer (10), on a back surface side of the metal layer (21); and a step for forming a back-surface electrode (40) on a back surface side of the carbide layer (20).

8 Claims, 11 Drawing Sheets

(51) Int. Cl.
*H01L 21/02* (2006.01)
*H01L 29/06* (2006.01)
*H01L 21/285* (2006.01)
H01L 21/78 (2006.01)
H01L 23/31 (2006.01)
H01L 21/56 (2006.01)

(52) U.S. Cl.
CPC ........ *H01L 23/544* (2013.01); *H01L 29/0619* (2013.01); *H01L 21/02057* (2013.01); *H01L 21/561* (2013.01); *H01L 21/78* (2013.01); *H01L 23/3171* (2013.01); *H01L 2223/54426* (2013.01)

(58) Field of Classification Search
CPC ... H01L 21/561; H01L 23/3171; H01L 21/78; H01L 2223/54426; H01L 21/02057; H01L 21/02378; H01L 29/166053
See application file for complete search history.

(56) References Cited

FOREIGN PATENT DOCUMENTS

| | | |
|---|---|---|
| JP | 2013-105881 | 5/2013 |
| JP | 2015-115583 | 6/2015 |
| WO | 2012/049792 | 4/2012 |

\* cited by examiner

METHOD FOR MANUFACTURING SILICON CARBIDE SEMICONDUCTOR DEVICE, METHOD FOR MANUFACTURING SEMICONDUCTOR BASE, SILICON CARBIDE SEMICONDUCTOR DEVICE, AND DEVICE FOR MANUFACTURING SILICON CARBIDE SEMICONDUCTOR DEVICE

CROSS-REFERENCE TO RELATED APPLICATION

This application is the U.S. National Stage of International Patent Application No. PCT/JP2015/084828 filed on Dec. 11, 2015, the disclosure of which is incorporated in its entirety herein by reference.

TECHNICAL FIELD

The present invention relates to a method for manufacturing a silicon carbide semiconductor device, a method for manufacturing a semiconductor base, a silicon carbide semiconductor device, and a device for manufacturing a silicon carbide semiconductor device.

BACKGROUND ART

Conventionally, reduction in thickness (thinning) of a silicon carbide wafer has been attempted in order to reduce a thickness of a silicon carbide element. When reducing a thickness of a silicon carbide wafer, for example, a grinding technique is used. On the other hand, when reducing a thickness of a silicon carbide wafer, warpage may be generated. As a technique for eliminating such warpage, for example, the following technique is proposed in WO2012/049792 (paragraph [0038]). (1) After thinning is performed, a Ni film is formed on a back surface, and then laser annealing is performed to the Ni film, thereby forming a silicide layer. (2) By thinning a substrate (wafer) as described above, large warpage is generated. However, an amount of the warpage of the substrate (wafer) is adjusted by removing (surface-treating) at least a part of an affected layer formed on a ground surface after the thinning.

SUMMARY OF INVENTION

Technical Problem

The present invention provides a method for manufacturing a silicon carbide semiconductor device, a method for manufacturing a semiconductor base, a silicon carbide semiconductor device, and a device for manufacturing a silicon carbide semiconductor device, with which warpage is eliminated or reduced in a thinned silicon carbide wafer by a simple technique without removing an affected layer, unlike conventional WO2012/049792.

Solution to Problem

A method for manufacturing a silicon carbide semiconductor device comprises:
a step for forming a front-surface electrode on a front surface side of a silicon carbide wafer;
a step for thinning the silicon carbide wafer by reducing a thickness of the silicon carbide wafer from a back surface side thereof;
a step for providing a metal layer on the back surface of the thinned silicon carbide wafer;
a step for irradiating the metal layer with laser light, while applying an external force such that the silicon carbide wafer and the metal layer are planarized, to form the carbide layer obtained by a reaction with carbon in the silicon carbide wafer, on a back surface side of the metal layer; and
a step for forming a back-surface electrode on a back surface side of the carbide layer.

In the method for manufacturing the silicon carbide semiconductor device according to the present invention,
the laser light irradiation may be performed such that a portion to be irradiated with laser light partially overlaps with a portion which was irradiated with the laser light,
a high-density portion having high carbide density may be formed by overlapping of portions irradiated with the laser light, and
wherein a low-density portion having low carbide density may be formed by non-overlapping of portions irradiated with the laser light.

In the method for manufacturing the silicon carbide semiconductor device according to the present invention,
the laser light irradiation may be performed such that a portion to be irradiated with laser light partially overlaps with a portion which was irradiated with the laser light,
a low-density portion having low carbide density may be formed by overlapping of portions irradiated with the laser light, and
a high-density portion having high carbide density may be formed by non-overlapping of portions irradiated with the laser light.

In the method for manufacturing the silicon carbide semiconductor device according to the present invention,
wherein the laser light irradiation is performed along a first direction,
wherein when a particular laser light irradiation is finished along the first direction, another laser light irradiation, starting from another position spaced apart at an interval, is performed along the first direction.

In the method for manufacturing the silicon carbide semiconductor device according to the present invention,
wherein the external force is applied by an adsorption power by a vacuum adsorption unit, or by a pressing force by a pressing unit made of a member which transmits the laser light.

In the method for manufacturing the silicon carbide semiconductor device according to the present invention,
wherein the metal layer is titanium, molybdenum, or titanium and molybdenum.

In the method for manufacturing the silicon carbide semiconductor device according to the present invention,
wherein the laser light is green laser.

A method for manufacturing a semiconductor base comprises:
a step for thinning a silicon carbide wafer by reducing a thickness of the silicon carbide wafer from a back surface side thereof;
a step for providing a metal layer on the back surface of the thinned silicon carbide wafer; and
a step for irradiating the metal layer with laser light, while applying an external force such that the silicon carbide wafer and the metal layer are planarized, to form the carbide layer obtained by a reaction with carbon in the silicon carbide wafer, on a back surface side of the metal layer.

A silicon carbide semiconductor device comprises:
a silicon carbide wafer,
a front-surface electrode provided on a front surface side of the silicon carbide wafer, a carbide layer provided on a back surface of the silicon carbide wafer which has been thinned, and a back-surface electrode provided on a back surface side of the carbide layer wherein the carbide layer includes a high-density portion having high carbide density and a low-density portion having low carbide density, and wherein the high-density portion is provided along two different directions which are in-plane directions of the carbide layer.

A manufacturing device comprises:

a first electrode formation unit, which forms a front-surface electrode on a front surface side of a silicon carbide wafer;

a thinning processing unit, which thins the silicon carbide wafer by reducing the thickness of the silicon carbide wafer from the back surface side thereof;

a metal layer formation unit, which provides a metal layer on a back surface of the silicon carbide wafer which has been thinned;

an external force applying unit, which applies an external force such that the silicon carbide wafer and the metal layer are planarized;

a laser light irradiation unit, which irradiates the metal layer, while the external force is being applied by the external force applying unit, with laser light to form a carbide layer obtained by a reaction with carbon in the silicon carbide wafer, on the back surface side of the metal layer; and a second electrode formation unit, which forms a back-surface electrode on a back surface side of the carbide layer.

Advantageous Effects of Invention

According to the present invention, it is possible to eliminate or reduce warpage of the thinned silicon carbide wafer by irradiating the metal layer with laser light to form, not a silicide layer but the carbide layer, while applying an external force such that the silicon carbide wafer and the metal layer are planarized. Consequently, unlike the conventional technique provided by WO2012/049792, it is possible to eliminate or reduce warpage of the thinned silicon carbide wafer by a simple technique without removing an affected layer.

DESCRIPTION OF EMBODIMENTS

First Embodiment
<<Configuration>>

Figure 1:
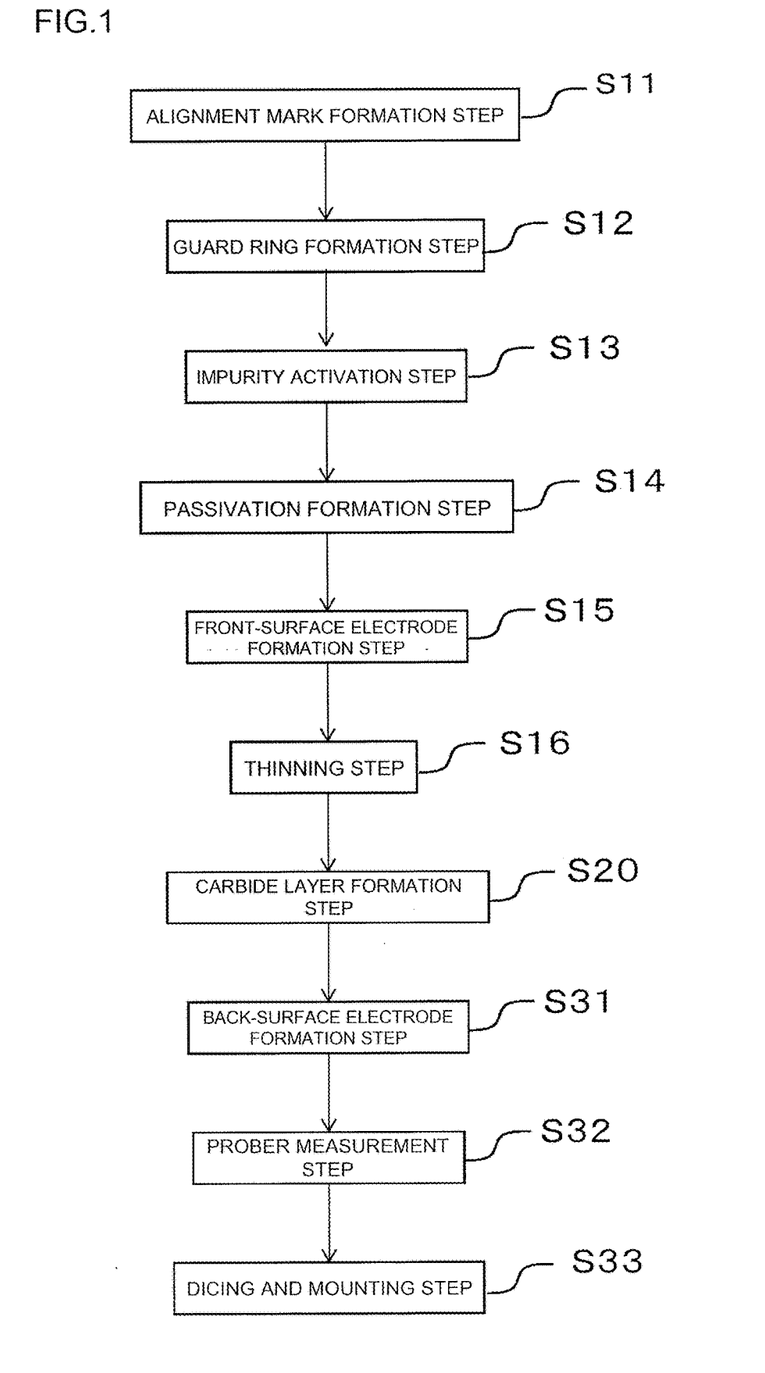
FIG. 1 illustrates steps in a method for manufacturing a silicon carbide semiconductor device according to a first embodiment of the present invention.
Figure 4:
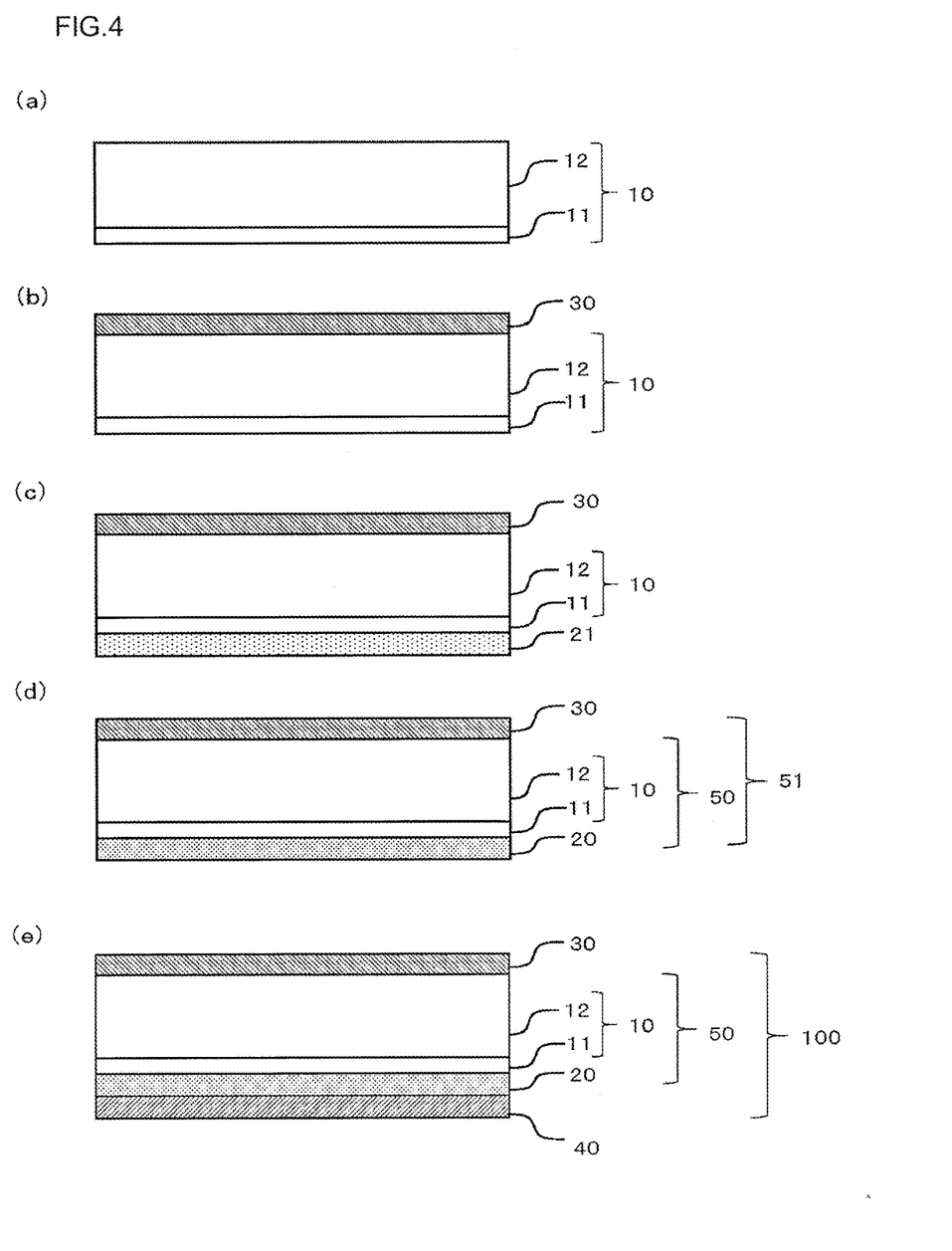
FIGS. 4(a) to 4(e) are sectional views illustrating a layer configuration regarding a part of steps for manufacturing the silicon carbide semiconductor device according to the first embodiment of the present invention.

A method for manufacturing a silicon carbide semiconductor device in the embodiment includes, as illustrated in FIG. 1, a step for forming a front-surface electrode 30 including metal on a front surface side of a silicon carbide wafer 10 (front-surface electrode formation step S15, see FIG. 4(b)), and a step for thinning the silicon carbide wafer 10 by reducing the thickness of the silicon carbide wafer 10 from a back surface side thereof (thinning step S16). The silicon carbide wafer 10 prepared in FIG. 4(a) includes, for example, a silicon carbide substrate 11 and a silicon carbide layer 12 formed on the silicon carbide substrate 11, for example, by epitaxial growth.

As illustrated in FIG. 1, the method for manufacturing the silicon carbide semiconductor device 100 includes a step for forming a carbide layer 20 (carbide layer formation step S20). The carbide layer formation step S20 includes, as illustrated in FIG. 2, a step for providing a metal layer 21 on the back surface of the thinned silicon carbide wafer 10 (metal layer formation step S25, see FIG. 4(c)), and a step for irradiating the metal layer 21 with laser light, while applying an external force such that the silicon carbide wafer 10 and the metal layer 21 are planarized, to form the carbide layer 20 obtained by a reaction with carbon in the silicon carbide wafer, on a back surface side of the metal layer 21 (laser irradiation step S26, see FIG. 4(d)).

In the embodiment, although a description will be given using an aspect in which the entire metal layer 21 is changed into the carbide layer 20, there is no limitation thereto. For example, only a part of the metal layer 21 on the back surface side thereof (a lower part of the metal layer 21 in FIG. 4(c)) may be changed into the carbide layer 20, and a part of the metal layer 21 on the front surface side thereof (an upper part of the metal layer 21 in FIG. 4(c)) may remain unchanged as the metal layer 21. However, by changing the entire metal layer 21 into the carbide layer 20, it is possible to more surely suppress warpage of the thinned silicon carbide wafer 10 (or a front-surface electrode-equipped silicon carbide base 51 described later). In addition, from the viewpoint of obtaining an effect of more surely suppressing warpage, it is more preferable to change the entire surface of the metal layer 21 into the carbide layer 20 than to change a part thereof into the carbide layer 20 in an in-plane direction.

As illustrated in FIG. 1, the method for manufacturing the silicon carbide semiconductor device 100 includes a step for forming a back-surface electrode 40 including metal on a back surface side of the carbide layer 20 (back-surface electrode formation step S31, see FIG. 4(e)). In the embodiment, a description will be given using, as an example, an aspect in which the front-surface electrode formation step S15, the thinning step S16, the metal layer formation step S25, the laser irradiation step S26, and the back-surface electrode formation step S31 are formed in order. However, there is no limitation thereto, and the order of these steps can be appropriately changed. However, since warpage of the silicon carbide wafer 10 generated in the thinning step S16 can be suppressed by performing the front-surface electrode formation step S15 prior to the thinning step S16, it is preferable to perform the front-surface electrode formation step S15 prior to the thinning step S16 from this viewpoint.

Figure 2:
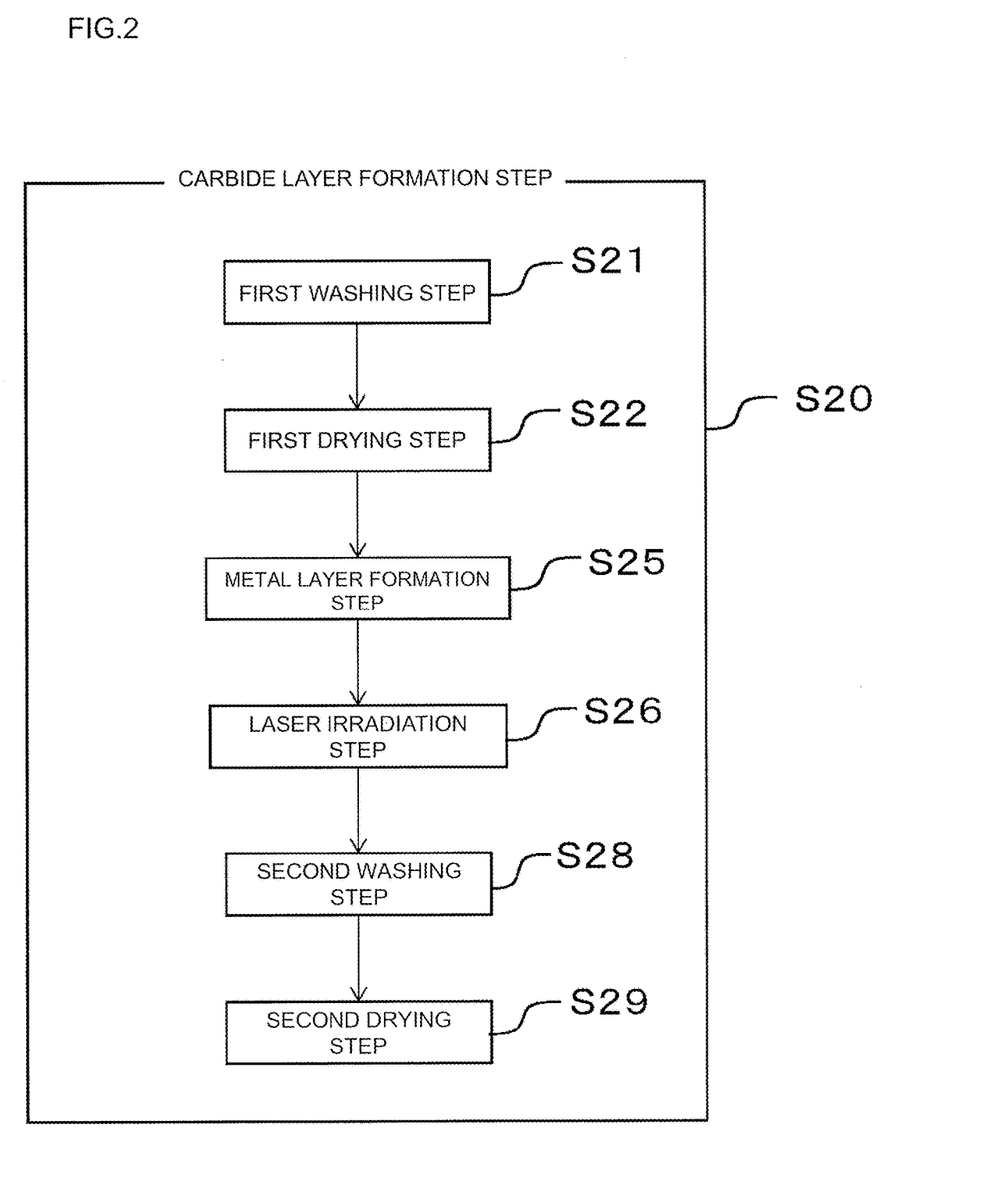
FIG. 2 illustrates steps included in a carbide layer formation step according to the first embodiment of the present invention.

As illustrated in FIG. 2, the carbide layer formation step S20 includes a step for washing at least a back surface of the silicon carbide wafer 10 subjected to the thinning step S16 (first washing step S21), and a step for drying the silicon carbide wafer 10 subjected to the first washing step S21 (first drying step S22). In addition, the carbide layer formation step S20 includes a step for washing a silicon carbide base 50 subjected to the laser irradiation step S26 and including the carbide layer 20 formed therein (second washing step S28), and a step for drying the silicon carbide wafer 10 subjected to the second washing step S28 (second drying step S29). Regarding the first drying step S22 and the second drying step S29, an aspect may be adopted in which the silicon carbide wafer 10 or the silicon carbide base 50 is rotated and dried (spin dry). In the embodiment, the "silicon carbide base 50" means the silicon carbide wafer 10 including the carbide layer 20 formed on the back surface side thereof (see FIG. 3). In the embodiment, that which includes the silicon carbide wafer 10, the carbide layer 20, and the front-surface electrode 30 is indicated as the front-surface electrode-equipped silicon carbide base 51 (see FIG. 4(d)).

In general, warpage is generated in the silicon carbide wafer 10 when the thickness of the silicon carbide wafer 10 is reduced by the thinning step S16. As an example, warpage of 100 μm or larger is generated on that occasion. In addition, the laser irradiation step S26 in the carbide layer formation step S20 may be performed, for example, under vacuum conditions and at a temperature of 1000° C.

Besides, the method for manufacturing the silicon carbide semiconductor device 100 in the embodiment includes, as illustrated in FIG. 1, a step for forming an alignment mark (alignment mark formation step S11), a step for forming a guard ring (guard ring formation step S12), a step for activating impurities (impurity activation step S13), and a step for forming a passivation film (passivation film formation step S14). As an example, these steps are performed prior to the front-surface electrode formation step S15 described above. In addition, the method for manufacturing the silicon carbide semiconductor device 100 in the embodiment includes, subsequent to the back-surface electrode formation step S31, a step for measuring electrical properties with a prober (prober measurement step S32), a step for dicing the silicon carbide base 50 (dicing step), and a step for mounting on a front surface of the silicon carbide base 50 (mounting step). In FIG. 1, the dicing step and the mounting step are collectively illustrated as "S33".

Various methods can be adopted to provide the metal layer 21. For example, the metal layer 21 can be provided by deposition or sputtering. As an example, the thickness of the metal layer 21 to be provided is about 50 to 500 nm.

Figure 7:
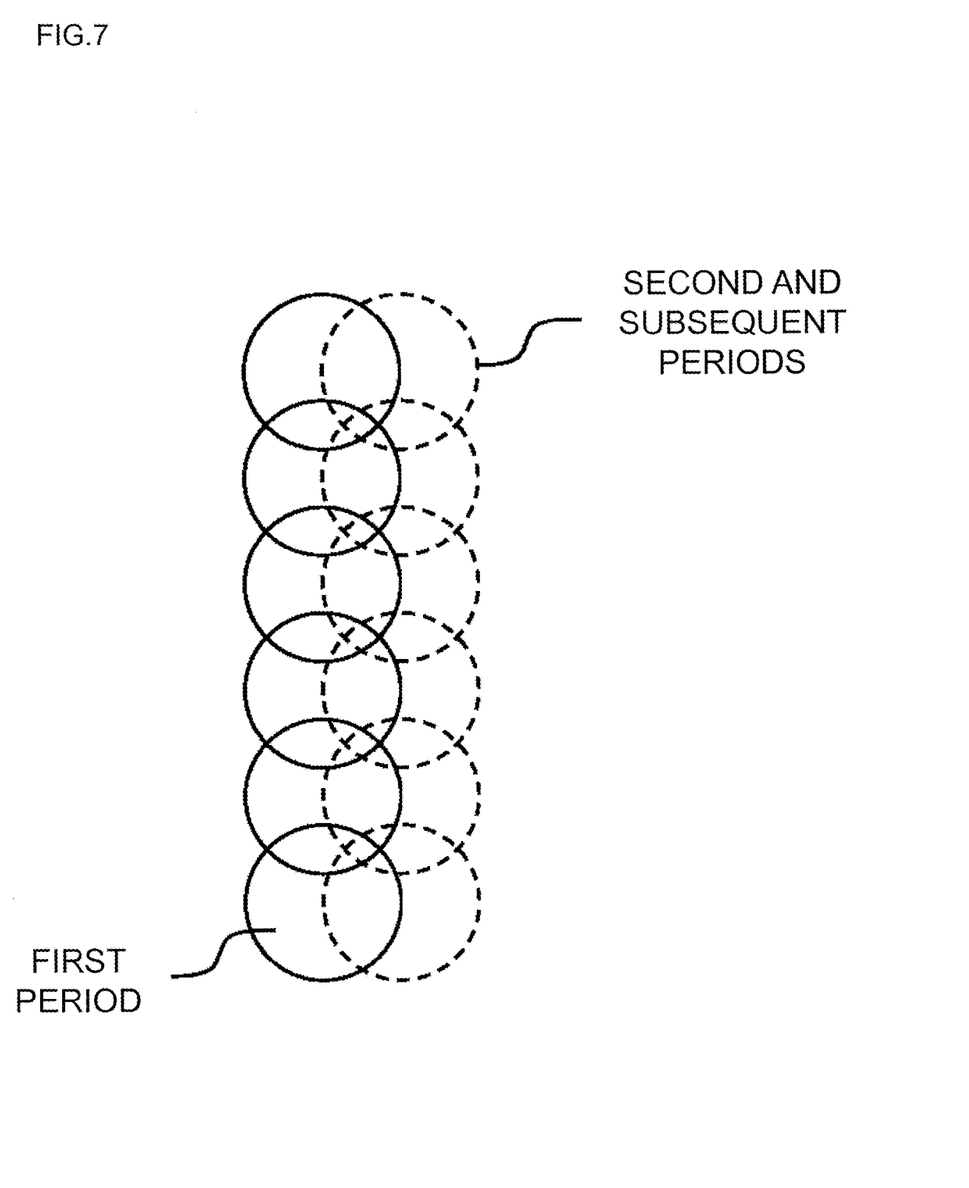
FIG. 7 is a plan view illustrating an aspect in which the laser light partially overlaps in the laser irradiation step according to the first embodiment of the present invention.
Figure 8:
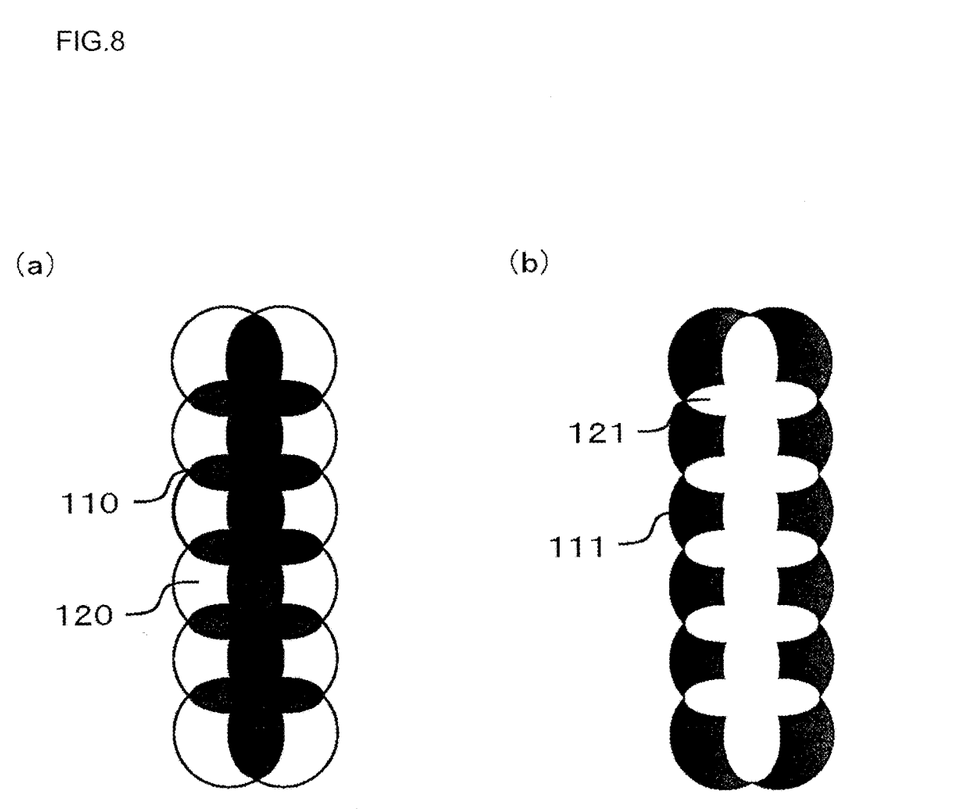
FIG. 8(a) is a plan view illustrating an aspect in which a portion irradiated with the laser light in an overlapping manner has become a high-density portion, and a portion irradiated with the laser light in a non-overlapping manner has become a low-density portion in a carbide layer formed in the first embodiment of the present invention.
FIG. 8(b) is a plan view illustrating an aspect in which a portion irradiated with the laser light in an overlapping manner has become a low-density portion, and a portion irradiated with the laser light in a non-overlapping manner has become a high-density portion in the carbide layer formed in the first embodiment of the present invention.

In the carbide layer formation step S20, as illustrated in FIG. 7, laser light irradiation may be performed such that a portion to be irradiated with laser light partially overlaps with a portion which was irradiated with the laser light. Then, as illustrated in FIG. 8(a), a high-density portion 110 having high carbide density may be formed by overlapping of portions irradiated with the laser light, and a low-density portion 120 having low carbide density may be formed by non-overlapping of portions irradiated with the laser light. To the contrary, as illustrated in FIG. 8(b), a low-density portion 121 having low carbide density may be formed by overlapping of portions irradiated with the laser light, and a high-density portion 111 having high carbide density may be formed by non-overlapping of portions irradiated with the laser light. Whether the high-density portion or the low-density portion is formed by overlapping of portions irradiated with laser light is determined depending on factors such as materials constituting the layer, intensity of laser light used for irradiation, an atmosphere in which the carbide layer 20 is formed (such as gas atmosphere, pressure, and temperature).

Figure 6:
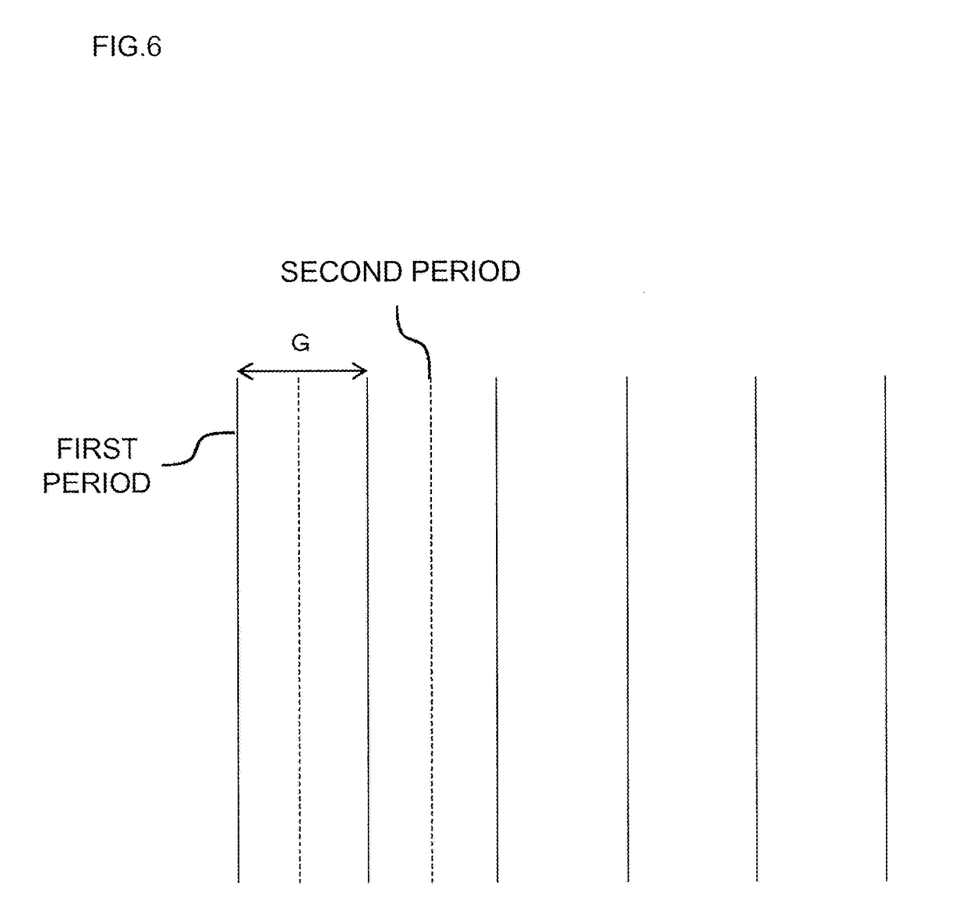
FIG. 6 is a plan view illustrating an aspect in which irradiation with laser light is performed in a laser irradiation step according to the first embodiment of the present invention.

As illustrated in FIG. 6, laser light irradiation may be performed along a first direction in the carbide layer formation step S20. The first direction is a "vertical direction" in FIG. 6. When a particular laser light irradiation is finished along the first direction, another laser light irradiation, starting from another position spaced apart at a movement interval G, may be performed along the first direction. The expression "when a particular laser light irradiation is finished along the first direction" means, in a case where the laser light irradiation is performed from one end of a wafer along the first direction, when the laser light irradiation has been performed to the other end thereof. The "movement interval G" can be determined appropriately, and for example, may be an interval equivalent to ¼ to ¹⁄₁₀₀ of a diameter of the wafer.

When the laser light irradiation for the position shifted by the movement interval G is finished from one end to the other end in a second direction perpendicular to the first direction (when a "first period" in FIG. 6 is finished), the laser light irradiation for a next period (a "second period" in FIG. 6) is performed. On that occasion, a portion (for example, an intermediate position) between portions irradiated with the laser light in the previous period (the first period) may be irradiated with the laser light (see FIG. 6), or the portions irradiated with the laser light in the previous period (the first period) may be irradiated with the laser light in an overlapping manner (see FIG. 7).

Figure 5:
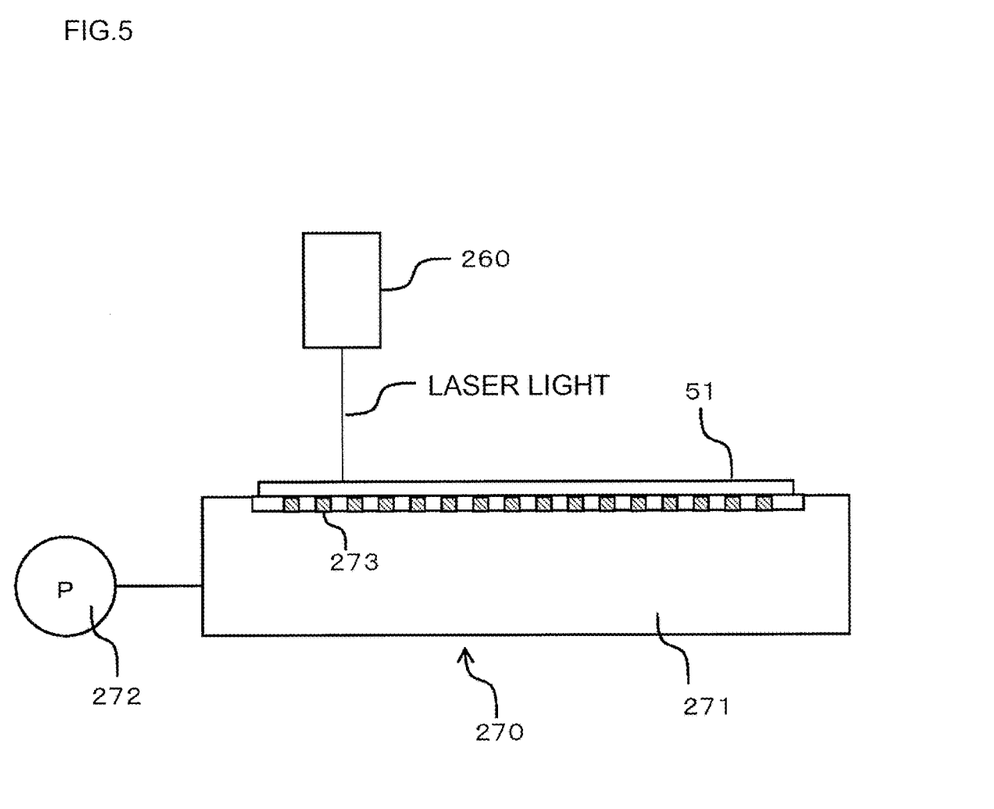
FIG. 5 is a side view schematically illustrating a part of a manufacturing device for manufacturing the silicon carbide semiconductor device according to the first embodiment of the present invention.

The external force applied in the carbide layer formation step S20 may be applied by an adsorption power by a vacuum adsorption unit 270 illustrated in FIG. 5. Absorption by the vacuum adsorption unit 270 may be set, for example, to 30 cmHg or more, and as an example, may be set to 30 cmHg or more and 60 cmcmHg or less.

As illustrated in FIG. 5, the vacuum adsorption unit 270 supports the front-surface electrode-equipped silicon carbide base 51, and includes a placement table 271 and a suction unit 272. The placement table 271 includes a plurality of suction holes 273 in a front surface thereof. The suction unit 272 includes a suction pump which applies, through the suction holes 273, a suction power to the silicon carbide wafer 10 placed on the placement table 271. Although it is not illustrated in FIG. 5, the placement table 271 includes a hollow portion having a hollow shape in order to transmit the suction power from the suction unit 272 to the suction holes 273. The plurality of suction holes 273 may be successively provided in a line along the first direction, or may be successively provided in a line along the second direction perpendicular to the first direction. In addition, the plurality of suction holes 273 may not be provided in a line, but be placed on the surface of the placement table 271 concentrically at equal intervals. In a case where the plurality of suction holes 273 is successively provided in a line along the first direction, the plurality of suction holes 273 may be successively provided in parallel at intervals corresponding to the above-described "movement interval G", for example, intervals 0.5 to 2 times as long as the "movement interval G".

The metal layer 21 formed in the metal layer formation step S25 may be a layer including titanium and molybdenum. The metal layer 21 may include only titanium, only molybdenum, or only titanium and molybdenum. The expression "only titanium" also means a case where a component other than titanium is included at an impurity level. Likewise, the expression "only molybdenum" also means a case where a component other than molybdenum is included at an impurity level. When only titanium is used as the metal layer 21, the carbide layer 20 is formed by titanium carbide, and when only molybdenum is used as the metal layer 21, the carbide layer 20 is formed by molybdenum carbide.

Green laser may be used as the laser light used in the carbide layer formation step S20. Output of the laser light may be set to 0.5 W or more at 10 kHZ, and for example, may be set to 0.5 W or more and 1.0 W or less. A total energy amount of laser may be set, for example, to 0.7 J/cm$^2$ or more, and for example, may be set to 0.7 J/cm$^2$ or more and 1.4 J/cm$^2$ or less. A laser scan speed may be set, for example, to 200 mm/sec or more, and for example, may be set to 200 mm/sec or more and 300 mm/sec or less.

Figure 3:
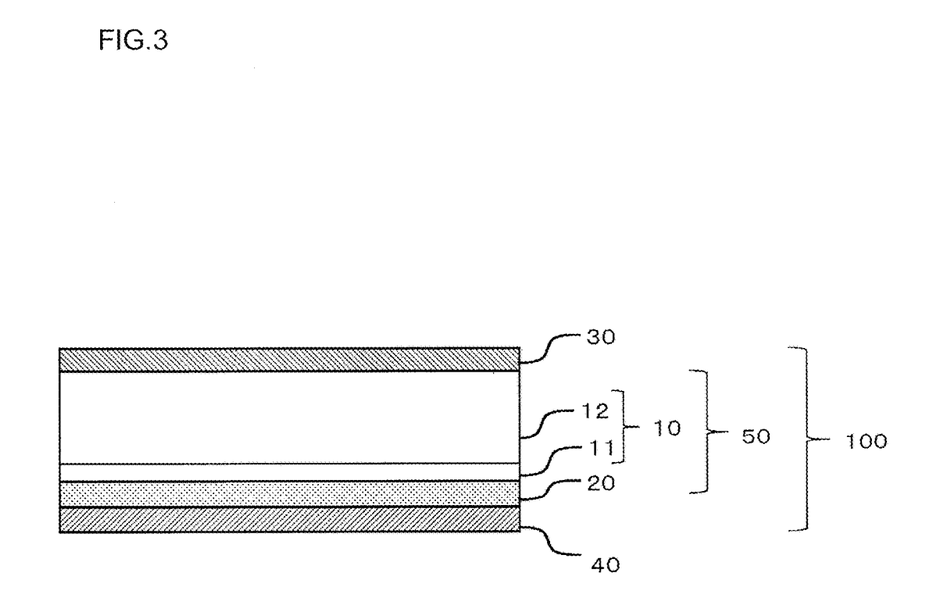
FIG. 3 is a sectional view illustrating a layer configuration of the silicon carbide semiconductor device according to the first embodiment of the present invention.
Figure 9:
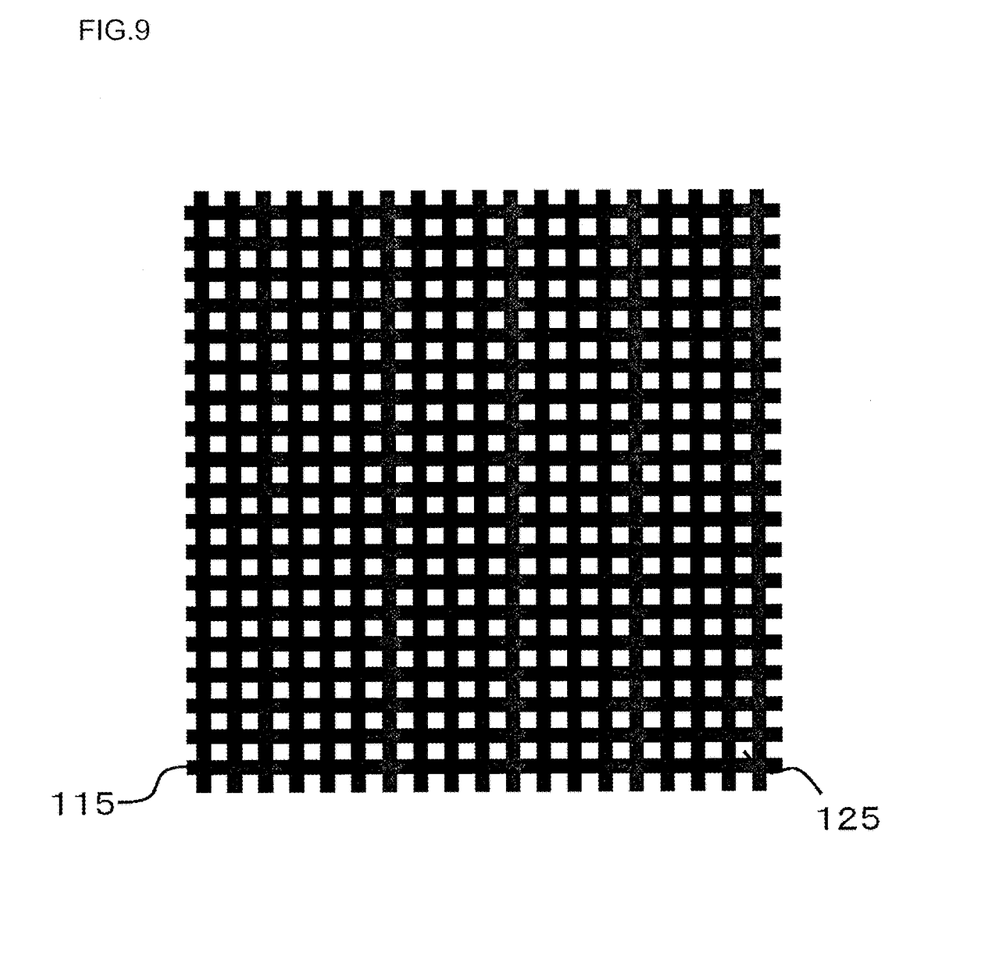
FIG. 9 is a plan view illustrating an aspect in which the high-density portion is formed into a lattice shape in the carbide layer formed in the first embodiment of the present invention.

As illustrated in FIG. 3, the silicon carbide semiconductor device 100 manufactured by the method for manufacturing the silicon carbide semiconductor device 100 according to the embodiment may include the silicon carbide wafer 10, the front-surface electrode 30 provided on the front surface side of the silicon carbide wafer 10, the carbide layer 20 provided on the back surface of the silicon carbide wafer 10 which has been thinned, and the back-surface electrode 40 provided on the back surface side of the carbide layer 20. The carbide layer 20 may include, as illustrated in FIG. 9, a high-density portion 115 having high carbide density and a low-density portion 125 having low carbide density. In addition, the high-density portion 115 may be provided along two different directions which are in-plane directions of the carbide layer 20. An example of the two different directions includes, as illustrated in FIG. 9, two directions which are perpendicular to each other in a plane of the silicon carbide wafer 10. With the high-density portion 115 thus formed into a lattice shape, it is possible to more surely suppress warpage of the thinned silicon carbide wafer 10 (or the front-surface electrode-equipped silicon carbide base 51).

Figure 10:
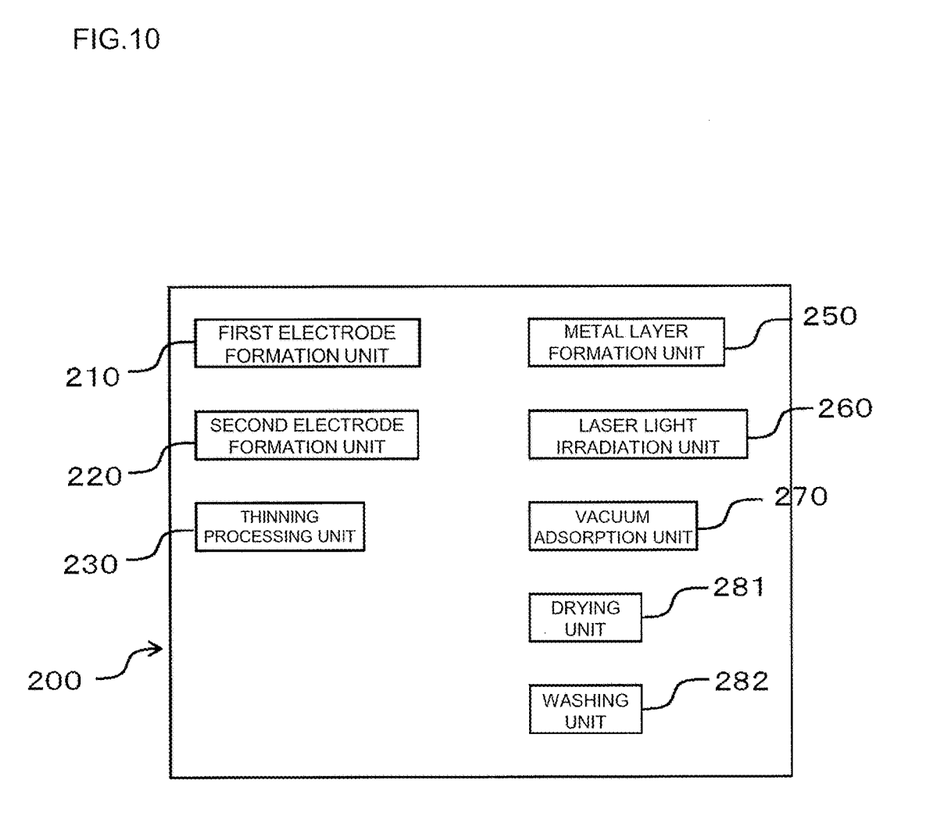
FIG. 10 is a block diagram illustrating a part of the manufacturing device for manufacturing the silicon carbide semiconductor device according to the first embodiment of the present invention.

As a manufacturing device 200 used in the method for manufacturing the silicon carbide semiconductor device 100 according to the embodiment, as illustrated in the block diagram in FIG. 10 as an example, a device can be used which includes a first electrode formation unit 210, a thinning processing unit 230, a metal layer formation unit 250, an external force applying unit (in the embodiment, the vacuum adsorption unit 270), a laser light irradiation unit 260, and a second electrode formation unit 220. The first electrode formation unit 210 forms the front-surface electrode 30 on the front surface side of the silicon carbide wafer 10. The thinning processing unit 230 thins the silicon carbide wafer 10 by reducing the thickness of the silicon carbide wafer 10 from the back surface side thereof. The metal layer formation unit 250 provides the metal layer 21 on the back surface of the silicon carbide wafer 10 which has been thinned. The external force applying unit applies an external force such that the silicon carbide wafer 10 and the metal layer 21 are planarized. The laser light irradiation unit 260 irradiates the metal layer 21, to which the external force is being applied by the external force applying unit, with laser light to form the carbide layer 20 obtained by a reaction with carbon in the silicon carbide wafer, on the back surface side of the metal layer 21. The second electrode formation unit 220 forms the back-surface electrode 40 on the back surface side of the carbide layer 20. In the embodiment, by applying an external force to the front-surface electrode-equipped silicon carbide base 51 by the external force applying unit, the external force is applied to the silicon carbide wafer 10.

As illustrated in the block diagram in FIG. 10, the manufacturing device 200 may include a drying unit 281 and a washing unit 282. The drying unit 281 performs the first drying step S22 and the second drying step S29 illustrated in FIG. 2. The washing unit 282 performs the first washing step S21 and the second washing step S28 illustrated in FIG. 2.

As the first electrode formation unit 210 and the second electrode formation unit 220, those already known as a device for forming electrodes can be used. The first electrode formation unit 210 and the second electrode formation unit 220 may be devices different from each other, or may be devices the same as each other.

As the thinning processing unit 230, for example, a grinding device for grinding and reducing the thickness of the silicon carbide wafer 10 may be used, or a reactor for reducing the thickness of the silicon carbide wafer 10 with a chemical reaction may be used.

As the metal layer formation unit 250, for example, a deposition device for depositing the metal layer 21 may be used, or a sputtering device for providing the metal layer 21 by performing sputtering may be used.

As the external force applying unit, the vacuum adsorption unit 270 described above, a pressing unit 290 used in a second embodiment, and the like can be used. As the drying unit 281, for example, a spin dryer and the like can be used. As the washing unit 282, a conventionally known wafer washing device can be used.

<<Operation and Effect>>

Next, an operation and an effect exhibited by the embodiment including the above-described configuration will be described.

According to the embodiment, it is possible to eliminate or reduce warpage of the thinned silicon carbide wafer 10 by irradiating the metal layer 21 with laser light to form, not a silicide layer but the carbide layer 20, while applying an external force such that the silicon carbide wafer 10 and the metal layer 21 are planarized. Consequently, unlike the conventional technique provided by WO2012/049792, it is possible to eliminate or reduce warpage of the thinned silicon carbide wafer 10 by a simple technique without removing an affected layer.

In the embodiment, in a case where an aspect is adopted in which laser light irradiation is performed such that a portion to be irradiated with laser light partially overlaps with a portion which was irradiated with the laser light, as illustrated in FIG. 8(a), it is possible to form a high-density portion having high carbide density by overlapping of portions irradiated with the laser light, and to form a low-density portion having low carbide density by non-overlapping of portions irradiated with the laser light. Alternatively, as illustrated in FIG. 8(b), it is possible to form a low-density portion having low carbide density by overlapping of portions irradiated with the laser light, and to form a high-density portion having high carbide density by non-overlapping of portions irradiated with the laser light. As a result, the low-density portion and the high-density portion can be formed in a definite pattern in a plane of the silicon carbide wafer (see FIG. 9). By the aspect as described above, it is possible to more surely eliminate or reduce warpage of the thinned silicon carbide wafer 10.

In the embodiment, in a case where an aspect is adopted in which when a particular laser light irradiation is finished along the first direction, another laser light irradiation, starting from another position spaced apart at a movement interval G, is performed along the first direction, as illustrated in FIG. 6, it is possible to reduce an influence of fluctuation of intensity of laser light, and to make the carbide layer 20 more uniform. There may be a case where laser light irradiation cannot be always performed at a constant intensity. Even in such a case, when the aspect is adopted, it is possible to reduce an influence of fluctuation of intensity of the laser light. As a result, it is possible to make properties (such as thickness and density) of the carbide layer 20 formed on the silicon carbide wafer 10 more uniform, and therefore, to more surely eliminate or reduce warpage of the thinned silicon carbide wafer 10.

In a case where the vacuum adsorption unit 270 is adopted as the external force applying unit as illustrated in FIG. 5, an external force can be applied uniformly. In addition, since other member is not positioned in a portion irradiated with the laser light, there is no influence of the "other member". Therefore, it is possible to form the carbide layer 20 while applying the external force, which is a uniform force, and making the intensity of the laser light and the like uniform. Accordingly, it is possible to more surely eliminate or reduce warpage of the thinned silicon carbide wafer 10.

By using titanium and/or molybdenum as the metal layer 21, the carbide layer 20 can be surely formed on the silicon carbide wafer 10. When using only titanium, only molybdenum, or only titanium and molybdenum as a material of the metal layer 21, a highly pure carbide layer 20 can be surely formed. As a result, it is possible to more surely eliminate or reduce warpage of the thinned silicon carbide wafer 10.

When green laser is used as the laser light, an inexpensive device can be adopted as the laser light irradiation unit 260 (see FIG. 5). Therefore, it is possible to manufacture products without spending much introduction cost or much maintenance cost.

Second Embodiment

Next, a second embodiment of the present invention will be described.

Figure 11:
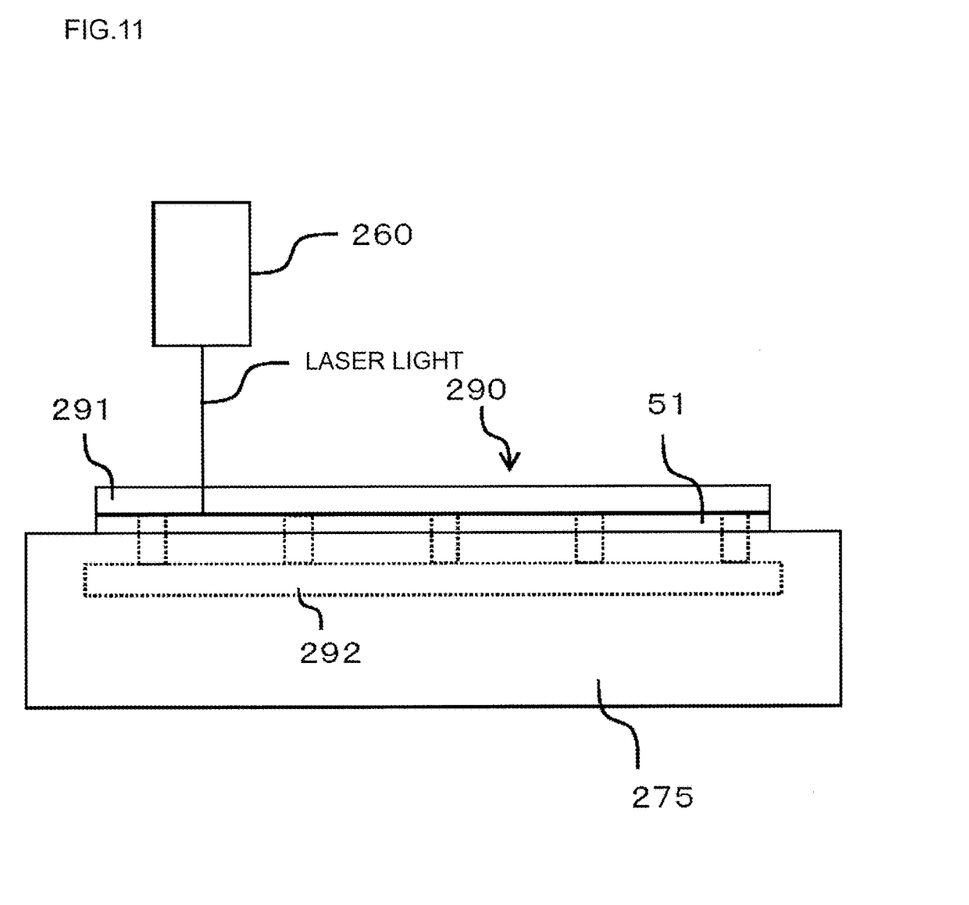
FIG. 11 is a side view schematically illustrating a part of a manufacturing device for manufacturing a silicon carbide semiconductor device according to a second embodiment of the present invention.

In the first embodiment, the external force applied in the carbide layer formation step S20 has been applied by the adsorption power generated by the vacuum adsorption unit 270. On the other hand, the second embodiment adopts an aspect in which the external force applied in the carbide layer formation step S20 is applied by a pressing force by the pressing unit 290 made of a member which transmits laser light, as illustrated in FIG. 11. In the embodiment, a description will be given using an aspect in which the pressing unit 290 is used instead of the vacuum adsorption unit 270. However, there is no limitation thereto, and the pressing unit 290 may be used together with the vacuum adsorption unit 270.

The pressing unit 290 of the embodiment may be made of a material which transmits laser light. Regarding the pressing unit 290, an aspect may be adopted in which the silicon carbide wafer 10 is pressed nearly entirely, or an aspect may be adopted in which only a part of the silicon carbide wafer 10, for example, only four end portions and a central portion are pressed. The pressing unit 290 may include a driving unit 292 and a pressing body 291. The driving unit 292 applies a pressing force. The pressing body 291 is connected to the driving unit 292 and transmits the pressing force from the driving unit to the silicon carbide wafer 10. As illustrated in FIG. 11, the driving unit 292 may be connected to the placement table 275 or may be provided in the placement table 275. The pressing force may be applied to the silicon carbide wafer 10 by the driving unit 292 drawing the pressing body 291 toward the placement table 275. As the driving unit 292, for example, those of hydraulic type can also be used.

Other configuration in the second embodiment adopts substantially the same aspect as that of the first embodiment.

The same effect as that of the first embodiment can be obtained with the embodiment. In addition, since the pressing unit 290 is adopted as the external force applying unit, it is possible to physically planarize the silicon carbide wafer 10. Consequently, the carbide layer 20 can be formed while almost forcibly planarizing the silicon carbide wafer 10. As a result, it is possible to more surely eliminate or reduce warpage of the thinned silicon carbide wafer 10.

Lastly, descriptions on the aforementioned respective embodiments and variations as well as disclosed drawings are merely examples for describing the invention described in CLAIMS. The descriptions on the aforementioned embodiments or disclosed drawings should not be construed to limit the invention described in CLAIMS.

REFERENCE SIGNS LIST

10 Silicon carbide wafer
20 Carbide layer
21 Metal layer
30 Front-surface electrode
40 Back-surface electrode
100 Silicon carbide semiconductor device
110, 111, 115 High-density portion
120, 121, 125 Low-density portion
200 Manufacturing device for a silicon carbide semiconductor device
210 First electrode formation unit
220 Second electrode formation unit
230 Thinning processing unit
250 Metal layer formation unit
260 Laser light irradiation unit
270 Vacuum adsorption unit
290 Pressing unit

What is claimed is:
1. A method for manufacturing a silicon carbide semiconductor device comprising:
a step for forming a front-surface electrode on a front surface side of a silicon carbide wafer;

a step for thinning the silicon carbide wafer by reducing a thickness of the silicon carbide wafer from a back surface side thereof;

a step for providing a metal layer on the back surface of the thinned silicon carbide wafer;

a step for irradiating the metal layer with laser light, while applying an external force such that the silicon carbide wafer and the metal layer are planarized, to form the carbide layer obtained by a reaction with carbon in the silicon carbide wafer, on a back surface side of the metal layer; and a step for forming a back-surface electrode on a back surface side of the carbide layer, wherein the carbide layer includes a high-density portion having high carbide density and a low-density portion having low carbide density, and wherein the high-density portion is provided along two different directions which are in-plane directions of the carbide layer.

2. The method for manufacturing the silicon carbide semiconductor device according to claim 1, wherein the laser light irradiation is performed such that a portion to be irradiated with laser light partially overlaps with a portion which was irradiated with the laser light.

3. The method for manufacturing the silicon carbide semiconductor device according to claim 1, wherein the laser light irradiation is performed along a first direction, wherein when a particular laser light irradiation is finished along the first direction, another laser light irradiation, starting from another position spaced apart at an interval, is performed along the first direction.

4. The method for manufacturing the silicon carbide semiconductor device according to claim 1, wherein the external force is applied by an adsorption power by a vacuum adsorption unit, or by a pressing force by a pressing unit made of a member which transmits the laser light.

5. The method for manufacturing the silicon carbide semiconductor device according to claim 1, wherein the metal layer is titanium, molybdenum, or titanium and molybdenum.

6. The method for manufacturing the silicon carbide semiconductor device according to claim 1, wherein the laser light is green laser.

7. A method for manufacturing a semiconductor base comprising:

a step for thinning a silicon carbide wafer by reducing a thickness of the silicon carbide wafer from a back surface side thereof;

a step for providing a metal layer on the back surface of the thinned silicon carbide wafer; and a step for irradiating the metal layer with laser light, while applying an external force such that the silicon carbide wafer and the metal layer are planarized, to form the carbide layer obtained by a reaction with carbon in the silicon carbide wafer, on a back surface side of the metal layer, wherein the carbide layer includes a high-density portion having high carbide density and a low-density portion having low carbide density, and wherein the high-density portion is provided along two different directions which are in-plane directions of the carbide layer.

8. A silicon carbide semiconductor device comprising:

a silicon carbide wafer, a front-surface electrode provided on a front surface side of the silicon carbide wafer, a carbide layer provided on aback surface of the silicon carbide wafer which has been thinned, and a back-surface electrode provided on a back surface side of the carbide layer wherein the carbide layer includes a high-density portion having high carbide density and a low-density portion having low carbide density, and wherein the high-density portion is provided along two different directions which are in-plane directions of the carbide layer.

* * * * *